US012635377B2

(12) United States Patent
Zhou

(10) Patent No.: US 12,635,377 B2
(45) Date of Patent: May 19, 2026

(54) DISPLAY PANEL INCLUDING COLOR FILTER LAYER

(71) Applicant: Wuhan China Star Optoelectronics Semiconductor Display Technology Co., Ltd., Wuhan (CN)

(72) Inventor: Jing Zhou, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1190 days.

(21) Appl. No.: 17/619,476

(22) PCT Filed: Nov. 8, 2021

(86) PCT No.: PCT/CN2021/129199
§ 371 (c)(1),
(2) Date: May 4, 2023

(87) PCT Pub. No.: WO2023/070736
PCT Pub. Date: May 4, 2023

(65) Prior Publication Data
US 2024/0040883 A1 Feb. 1, 2024

(30) Foreign Application Priority Data
Oct. 28, 2021 (CN) .......................... 202111261038.0

(51) Int. Cl.
*H10K 59/38* (2023.01)
*H10K 102/00* (2023.01)

(52) U.S. Cl.
CPC ....... *H10K 59/38* (2023.02); *H10K 2102/351* (2023.02)

(58) Field of Classification Search
None
See application file for complete search history.

(56) References Cited

U.S. PATENT DOCUMENTS

2012/0242939 A1* 9/2012 Li ...................... G02F 1/133514
359/891
2013/0128193 A1* 5/2013 Yang ................. G02F 1/133514
349/110
(Continued)

FOREIGN PATENT DOCUMENTS

CN 103304810 A 9/2013
CN 103996696 A 8/2014
(Continued)

OTHER PUBLICATIONS

International Search Report in International application No. PCT/CN2021/129199,mailed on Jul. 28, 2022.
(Continued)

*Primary Examiner* — Nduka E Ojeh
(74) *Attorney, Agent, or Firm* — PV IP PC; Peter Stecher; Wei Te Chung

(57) ABSTRACT

A display panel is provided. The display panel includes an array substrate, an emissive layer, a color filter layer, and a functional material layer stacked together. A refractive index difference between the color filter layer and the functional material layer is greater than or equal to −1 and less than or equal to 0.5. The color filter layer according to embodiments of the present invention not only has satisfactory optical parameters, can decrease reflectivity of the display, but can also be directly formed on the array substrate having the emissive layer, decreasing a thickness of the display panel and not damaging the emissive layer.

19 Claims, 2 Drawing Sheets

(56) References Cited

U.S. PATENT DOCUMENTS

| 2014/0311663 A1* | 10/2014 | Chao | ..................... G02B 5/201 |
| | | | 156/247 |
| 2018/0156951 A1* | 6/2018 | Baek | ................. G02F 1/133512 |
| 2018/0188621 A1 | 7/2018 | Qi et al. | |
| 2020/0225534 A1* | 7/2020 | Xu | ................... G02F 1/133711 |
| 2023/0309365 A1* | 9/2023 | Zhu | ..................... H10K 59/122 |
| 2023/0418111 A1* | 12/2023 | Zhang | .............. G02F 1/133526 |

FOREIGN PATENT DOCUMENTS

| CN | 111162110 A | 5/2020 |
| CN | 211455726 U | 9/2020 |
| CN | 112259695 A | 1/2021 |
| CN | 112786666 A | 5/2021 |
| CN | 113054136 A | 6/2021 |
| CN | 113299718 A | 8/2021 |
| CN | 113471382 A | 10/2021 |
| CN | 113554938 A | 10/2021 |
| CN | 114582924 A | 6/2022 |
| KR | 20210081603 A | 7/2021 |

OTHER PUBLICATIONS

Written Opinion of the International Search Authority in International application No. PCT/CN2021/129199,mailed on Jul. 28, 2022.
Chinese Office Action issued in corresponding Chinese Patent Application No. 202111261038.0 dated Oct. 31, 2022, pp. 1-10.
Chinese Office Action issued in corresponding Chinese Patent Application No. 202111261038.0 dated Apr. 1, 2023, pp. 1-13.

* cited by examiner

A                                         B

DISPLAY PANEL INCLUDING COLOR FILTER LAYER

CROSS-REFERENCE TO RELATED APPLICATION

This application is a national phase application under 35 U.S.C. § 371 of PCT Application No. PCT/CN2021/129199 filed Nov. 8, 2021, which claims priority to Chinese Application No. 202111261038.0 filed Oct. 28, 2021, the contents of which are incorporated herein by reference in their entirety.

FIELD OF INVENTION

The present invention relates to the field of display technology, and especially to a display panel.

BACKGROUND OF INVENTION

Polarizers (POLs) can effectively decrease reflectivity of organic light-emitting diode (OLED) panels under strong light, but almost 58% of light extraction would be lost, which is significantly detrimental to lifetime of OLED panels. On the other hand, polarizers have greater thicknesses and are brittle, so they are not suitable for development of dynamically bendable products. In order to develop dynamically bendable products based on OLED technologies, new materials, new technologies, and new manufacturing processes have to be introduced to replace polarizers.

Technology of using color filters to replace polarizers is categorized as POL-less technology. It not only decreases a thickness of a functional layer from 100 μm to thinner than 5 μm, but also increases extraction efficiency from 42% to 60%. However, in comparison with polarizers, a material and manufacturing processes of photoresist of color filter technologies have higher requirements, and a color filter consists of red, green, and blue color resist and a black matrix. Conventional color filter manufacturing processes require curing under a high temperature of 100 degrees Celsius to 300 degrees Celsius, and high temperatures damage light-emitting devices of an OLED panel. Therefore, conventional color filters cannot be directly manufactured on light-emitting devices, and they have to be separately manufactured on a substrate, and then laminated to the light-emitting devices through adhesive, causing a thickness of OLED panels unable to be further decreased.

SUMMARY OF INVENTION

Embodiments of the present invention provide a display panel to solve a technical problem that conventional color filters for decreasing reflectivity of a display panel cannot be directly manufactured on light-emitting devices, causing a thickness of display panels unable to be decreased.

In order to solve the above-described problem, technical approaches provided by the present invention are as follows:

Embodiments of the present invention provide a display panel that includes:

An array substrate;

An emissive layer disposed on the array substrate and including a first sub-pixel, a second sub-pixel, and a third sub-pixel having different colors;

A color filter layer disposed on the emissive layer and including a first color resist corresponding to the first sub-pixel, a second color resist corresponding to the second sub-pixel, a third color resist corresponding to the third sub-pixel, and a black matrix separating the first color resist, the second color resist, and the third color resist, wherein a material of the first color resist, a material of the second color resist, a material of the third color resist, and a material of the black matrix all include a photoresist material; and A functional material layer disposed on one side face of the color filter layer away from the emissive layer, wherein a difference between a refractive index of the first color resist, the second color resist, the third color resist, and the black matrix and a refractive index of the functional material layer is greater than or equal to −1 and less than or equal to 0.5.

In some embodiments of the present invention, a refractive index of the first color resist, a refractive index of the second color resist, a refractive index of the third color resist, and a refractive index of the black matrix are all less than or equal to 2, and a difference between a refractive index of the first color resist, the second color resist, and the third color resist and a refractive index of the black matrix is greater than or equal to 0 and less than or equal to 0.5.

In some embodiments of the present invention, a pixel definition layer is disposed between the array substrate and the color filter layer and includes a plurality of openings, and the first sub-pixel, the second sub-pixel, and the third sub-pixel are separately located in a corresponding opening; wherein an optical density value of the black matrix is greater than or equal to 1.5, an optical density value of the pixel definition layer is greater than or equal to 0.5, and a transmittance of the first color resist, a transmittance of the second color resist, and a transmittance of the third color resist are all greater than or equal to 50% and less than 80%.

In some embodiments of the present invention, a material of the pixel definition layer is a black organic material, and an orthographic projection of the black matrix on the array substrate is located in an orthographic projection of the pixel definition layer on the array substrate.

In some embodiments of the present invention, a touch control layer is disposed between the color filter layer and the emissive layer, the touch control layer includes a plurality of touch control electrodes, and an orthographic projection of the touch control electrodes on the array substrate is located in the orthographic projection of the black matrix on the array substrate.

In some embodiments of the present invention, the black matrix and at least one adjacent color resist have a gap therebetween to define a blank area, and an orthographic projection of the blank area on the array substrate is located in the orthographic projection of the pixel definition layer on the array substrate.

In some embodiments of the present invention, the orthographic projection of the black matrix on the array substrate partially overlaps an orthographic projection of any one adjacent color resist on the array substrate.

In some embodiments of the present invention, a curing temperature of the photoresist material ranges from 60 degrees Celsius to 90 degrees Celsius.

In some embodiments of the present invention, in mass percentage, the material of the black matrix includes 40%-50% of propylene glycol monomethyl ether acetate, 30%-40% of cyclohexanone, 1%-10% of carbon black, 5%-15% of acrylic resin, and 1%-5% of dimethyl succinate; wherein in the mass percentage, the material of the first color resist, the material of the second color resist, and the material of the third color resist include 70%-80% of 2-acetoxy-1-methoxy-propane, 5%-15% of 3-methoxy-3-methyl-1-butyl acetate, 1%-10% of a mixture of pentaerythritol triacrylate and pentaerythritol tetraacrylate, 1%-10% of light-sensitive resin, and 1%-10% of pigment or dye.

Embodiments of the present invention further provide another display panel that includes:

An array substrate;

An emissive layer disposed on the array substrate and including a first sub-pixel, a second sub-pixel, and a third sub-pixel having different colors;

A color filter layer disposed on the emissive layer and including a first color resist corresponding to the first sub-pixel, a second color resist corresponding to the second sub-pixel, a third color resist corresponding to the third sub-pixel, and a black matrix separating the first color resist, the second color resist, and the third color resist; and A functional material layer disposed on one side of the color filter layer away from the emissive layer, wherein a difference between a refractive index of the color filter layer and a refractive index of the functional material layer is greater than or equal to −1 and less than or equal to 0.5.

In some embodiments of the present invention, the functional material layer directly contacts one side face of the color filter layer away from the array substrate, and a difference between a refractive index of the first color resist, the second color resist, the third color resist, and the black matrix and the refractive index of the functional material layer is greater than or equal to −1 and less than or equal to 0.5.

In some embodiments of the present invention, a refractive index of the first color resist, a refractive index of the second color resist, a refractive index of the third color resist, and a refractive index of the black matrix are all less than or equal to 2, and a difference between a refractive index of the first color resist, the second color resist, and the third color resist and a refractive index of the black matrix is greater than or equal to 0 and less than or equal to 0.5.

In some embodiments of the present invention, a pixel definition layer is disposed between the array substrate and the color filter layer and includes a plurality of openings, and the first sub-pixel, the second sub-pixel, and the third sub-pixel are separately located in a corresponding opening; wherein an optical density value of the black matrix is greater than or equal to 1.5, an optical density value of the pixel definition layer is greater than or equal to 0.5, and a transmittance of the first color resist, a transmittance of the second color resist, and a transmittance of the third color resist are all greater than or equal to 50% and less than 80%.

In some embodiments of the present invention, a material of the pixel definition layer is a black organic material, and an orthographic projection of the black matrix on the array substrate is located in an orthographic projection of the pixel definition layer on the array substrate.

In some embodiments of the present invention, a touch control layer is disposed between the color filter layer and the emissive layer, the touch control layer includes a plurality of touch control electrodes, and an orthographic projection of the touch control electrodes on the array substrate is located in the orthographic projection of the black matrix on the array substrate.

In some embodiments of the present invention, the black matrix and at least one adjacent color resist have a gap therebetween to define a blank area, and an orthographic projection of the blank area on the array substrate is located in the orthographic projection of the pixel definition layer on the array substrate.

In some embodiments of the present invention, the orthographic projection of the black matrix on the array substrate partially overlaps an orthographic projection of any one adjacent color resist on the array substrate.

In some embodiments of the present invention, a material of the first color resist, a material of the second color resist, a material of the third color resist, and a material of the black matrix all include a photoresist material, and a curing temperature of the photoresist material ranges from 60 degrees Celsius to 90 degrees Celsius.

In some embodiments of the present invention, the photoresist material includes acrylic doped with pigment, dye, or carbon black.

In some embodiments of the present invention, in mass percentage, the material of the black matrix includes 40%-50% of propylene glycol monomethyl ether acetate, 30%-40% of cyclohexanone, 1%-10% of the carbon black, 5%-15% of acrylic resin, and 1%-5% of dimethyl succinate; wherein in the mass percentage, the material of the first color resist, the material of the second color resist, and the material of the third color resist include 70%-80% of 2-acetoxy-1-methoxypropane, 5%-15% of 3-methoxy-3-methyl-1-butyl acetate, 1%-10% of a mixture of pentaerythritol triacrylate and pentaerythritol tetraacrylate, 1%-10% of light-sensitive resin, and 1%-10% of the pigment or the dye.

The color filter layer according to embodiments of the present invention not only has satisfactory optical parameters, can decrease reflectivity of the display, but can also be directly formed on the array substrate having the emissive layer, without having to be separately manufactured on another substrate, decreasing a thickness of the display panel and not damaging the emissive layer.

DETAILED DESCRIPTION OF PREFERRED EMBODIMENTS

Figure 1:
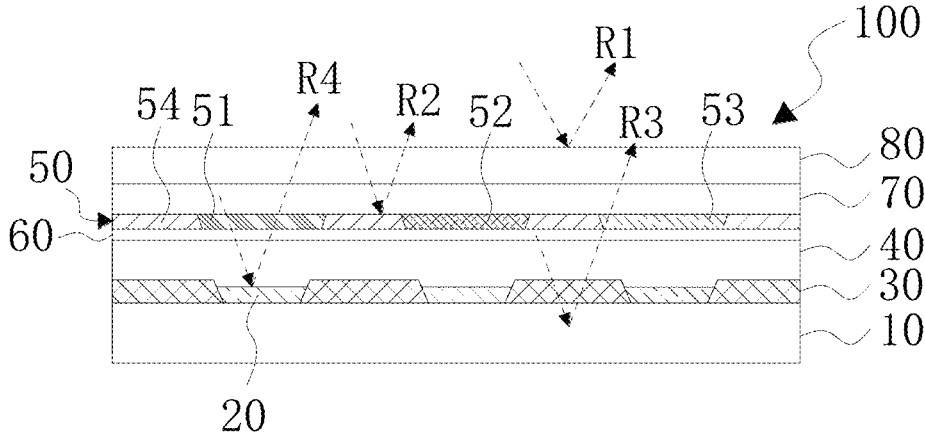
FIG. 1 is a schematic diagram of film layer stacking of a display panel according to embodiments of the present invention.

For better clearness and definiteness of purpose, technical approach, and effect of the present application, the following further describes embodiments of the present application in detail with reference to accompanying drawings. It should be understood that the embodiments described here is merely for explaining the present application and not intended to limit the present application.

In description of the present application, it should be understood that terms that indicates orientation or relation of position such as "thickness", "upper", "lower" are based on orientation or relation of position accompanying drawings show. They are simply for purpose of description of the present application and simplifying of description, and do not mean or suggest the devices or components have a specified orientation and constructed and operated in a specified orientation; therefore, it should not be understood as limitation of the present application. Furthermore, terms "first" and "second" are used simply for purpose of description and cannot be understood to mean or suggest relative importance or implicitly mean amount of the technical features. Therefore, features with terms "first" and "second" can mean or implicitly include one or more of the features. In description of the present application, "multiple" means two or more unless otherwise clearly and concretely specified.

Contents disclosed below provide many different embodiments or examples to realize different structures according to the present application. For the purpose of simplifying description of the present application, contents below describe parts and configuration of specific examples. Naturally, they are merely for illustration and do not intend to limit the present application. Furthermore, reference numerals and/or letters can be repeated in different examples of the present application, and this repeat is for the purse of simplification and clearness, not indicating relations between various embodiments and/or configurations under discussion. Furthermore, the present application provides examples of various specific processes and materials; however, a person of ordinary skill in the art can think of applications of other processes and/or materials.

Referring to FIG. 1, the present invention provides a display panel 100 that includes an array substrate 10, an emissive layer 20 disposed on the array substrate 10, and a color filter layer 50 disposed on the emissive layer 20. The array substrate 10 includes a pixel driving circuit configured to drive sub-pixels of the emissive layer 20 to emit light. The emissive layer 20 includes a first sub-pixel, a second sub-pixel, and a third sub-pixel having different colors. The color filter layer 50 includes a first color resist 51 corresponding to the first sub-pixel, a second color resist 52 corresponding to the second sub-pixel, a third color resist 53 corresponding to the third sub-pixel, and a black matrix 54 separating the first color resist 51, the second color resist 52, and the third color resist 53

The first sub-pixel, the second sub-pixel, and the third sub-pixel can be a red sub-pixel, a green sub-pixel, and a blue sub-pixel, respectively, and, correspondingly, the first color resist 51, the second color resist 52, and the third color resist 53 can be a red color resist, a green color resist, and a blue color resist, respectively.

The display panel 100 can be an organic light-emitting diode (OLED) display panel. In conventional technology, because limited by a material of a color filter film, it has to be cured under a high temperature of 100 degrees Celsius to 300 degrees Celsius, and because high temperatures damage devices in the emissive layer 20, the color filter film cannot be directly manufactured on the emissive layer 20. Because a color filter film has to be manufactured on another substrate, and then laminated to the array substrate 10 having the emissive layer 20 through adhesive, a conventional material of color filter films and high temperature curing processes are not suitable for development of thinner display panels. Embodiments of the present invention direct to the above-described drawbacks, improve the material of the color filter films, making them curable under a low temperature process, and decreasing reflectivity of display panels.

Specifically, a material of the first color resist 51, a material of the second color resist 52, a material of the third color resist 53, and a material of the black matrix 54 include a photoresist material, and a curing temperature of the photoresist material ranges from 60 degrees Celsius to 90 degrees Celsius, making the color filter layer 50 of the present invention able to be directly manufactured on the emissive layer 20 through a low temperature process. The color filter layer 50 does not have to be separately manufactured on another substrate, and adhesive does not have to be disposed between the color filter layer 50 and the emissive layer 20 for adhesion, facilitating decreasing a thickness of display panels.

The emissive layer 20 includes an anode, a hole functional layer, an organic light-emitting material layer, an electron functional layer, and a cathode sequentially stacked together, and each sub-pixel corresponds to an organic light-emitting diode.

The display panel 100 further includes a pixel definition layer 30. The pixel definition layer 30 is disposed between the array substrate 10 and the color filter layer 50 and includes a plurality of openings, and the first sub-pixel, the second sub-pixel, and the third sub-pixel are separately located in a corresponding opening.

In embodiments of the present invention, a material of the pixel definition layer 30 can be a black organic material. An orthographic projection of the black matrix 54 on the array substrate 10 is located in an orthographic projection of the pixel definition layer 30 on the substrate 10, preventing the black matrix 54 from affecting light-emitting effect of pixels underneath. An orthographic projection of the first color resist 51, the second color resist 52, and the third color resist 53 on the array substrate 10 covers an orthographic projection of a corresponding sub-pixel on the array substrate 10.

Figure 2:
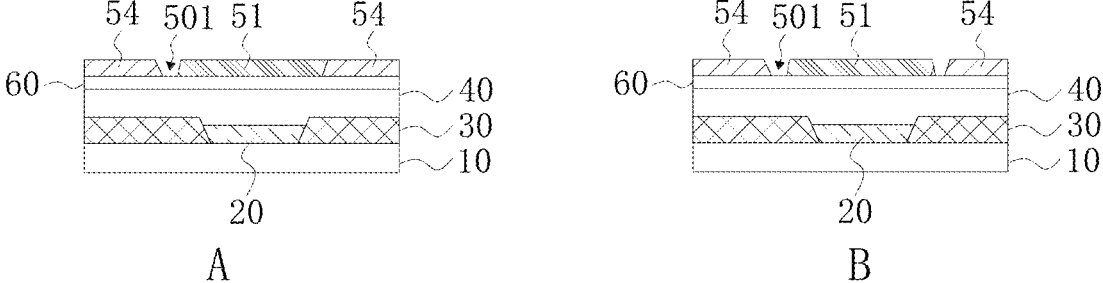
FIG. 2 is a schematic diagram of a black matrix with a gap between adjacent color resist according to embodiments of the present invention.

Referring to FIG. 2, in some embodiments, the black matrix 54 and at least one adjacent color resist (e.g. the first color resist 51) have a gap 501 therebetween, the gap between the black matrix 54 and a corresponding color resist defines a blank area, and an orthographic projection of the blank area on the array substrate 10 is located in the orthographic projection of the pixel definition layer 30 on the array substrate 10. Specifically, one side of the black matrix 54 and an adjacent color resist on this side can have the gap 501 therebetween, there is no gap 501 between other sides and corresponding color resist, and other sides can contact a boundary of a corresponding color resist. The black matrix 54 and all adjacent color resist can also have the gap 501 therebetween. In other embodiments, there is no gap 501 between the black matrix 54 and all adjacent color resist, that is, the orthographic projection of the black matrix 54 on the array substrate 10 partially overlaps an orthographic projection of any one adjacent color resist on the array substrate 10 to protect light-emitting diode devices, preventing the light-emitting diode devices from aging due to environmental ultraviolet irradiation.

Because organic light-emitting diode devices are sensitive to water vapor and oxygen, the emissive layer 20 can be entirely covered with an encapsulation layer 40 to block water vapor and oxygen, and the encapsulation layer 40 is disposed between the emissive layer 20 and the color filter layer 50.

A transparent material is used as a material of the encapsulation layer 40, and a composite film layer of an inorganic layer, an organic layer, and an inorganic layer stacked together can be used for the encapsulation layer 40.

Furthermore, a touch control layer 60 can be disposed on the encapsulation layer 40 to realize a touch control function. The touch control layer 60 can be disposed between the color filter layer 50 and the encapsulation layer 40, and the color filter layer 50 can be directly disposed on the touch control layer 60 in embodiments of the present invention. The touch control layer 60 includes a plurality of touch control electrodes, and an orthographic projection of the touch control electrodes on the array substrate 10 is located in the orthographic projection of the black matrix 54 on the array substrate 10, preventing metal wiring from affecting an aperture ratio of pixels. The touch control electrodes can be a metal mesh pattern.

Specifically, in embodiments of the present invention, the photoresist material includes acrylic doped with pigment, dye, or carbon black.

Furthermore, in mass percentage, the material of the black matrix 54 includes 40%-50% of propylene glycol monomethyl ether acetate, 30%-40% of cyclohexanone, 1%-10% of carbon black, 5%-15% of acrylic resin, and 1%-5% of dimethyl succinate.

In mass percentage, the material of the first color resist 51, the material of the second color resist 52, and the material of the third color resist 53 include 70%-80% of 2-acetoxy-1-methoxypropane, 5%-15% of 3-methoxy-3-methyl-1-butyl acetate, 1%-10% of a mixture of pentaerythritol triacrylate and pentaerythritol tetraacrylate, 1%-10% of light-sensitive resin, and 1%-10% of pigment or dye.

Specifically, when the first color resist 51 is a red color resist, correspondingly, the pigment is a red pigment, the dye is a red dye, a mass percentage of the pentaerythritol triacrylate is greater than zero, and a mass percentage of the pentaerythritol tetraacrylate is greater than zero. When the second color resist 52 is a green color resist, correspondingly, the pigment is a green pigment, the dye is a green dye, a mass percentage of the pentaerythritol triacrylate ranges from 1% to 10%, and there is no pentaerythritol tetraacrylate. When the third color resist 53 is a blue color resist, correspondingly, the pigment is a blue pigment, the dye is a blue dye, advantageously, the blue dye can be copper compounds, specifically copper(II) phthalocyanine, a mass percentage of the pentaerythritol triacrylate ranges from 1% to 10%, and there is no pentaerythritol tetraacrylate.

A functional material layer 70 is disposed on one side of the color filter layer 50 away from the emissive layer 20, a difference of a refractive index between the color filter layer 50 and the functional material layer 70 is greater than or equal to $-1$ and less than or equal to 0.5. Within this range, ambient light has a smaller reflectivity on a surface of the color filter layer 50.

Specifically, the functional material layer 70 directly contacts one side face of the color filter layer 50 away from the substrate 10, and a difference between a refractive index of the first color resist 51, the second color resist 52, the third color resist 53, and the black matrix 54 and a refractive index of the functional material layer 70 is greater than or equal to $-1$ and less than or equal to 0.5, that is, a difference of a refractive index between every color resist and the functional material layer 70 is $\Delta n_1$, $-1 \leq \Delta n_1 \leq 0.5$. A difference of a refractive index between the black matrix 54 and the functional material layer 70 is $\Delta n_2$, $-1 \leq \Delta n_2 \leq 0.5$. Setting a refractive index difference between each color resist of the color filter layer 50 and the black matrix 54, and the contacted functional material layer 70 above them in this range, the color filter layer 50 can better decrease reflectivity of the display panel 100. In embodiments of the present invention, advantageously, $0 \leq n_1 \leq 0.5$, and $0 \leq \Delta n_2 \leq 0.5$.

In embodiments of the present invention, a cover plate 80 is disposed on the color filter layer 50, the functional material layer 70 can be an adhesive layer, the color filter layer 50 can be directly formed on the array substrate 10, and therefore the color filter layer 50 is adhered to the cover plate 80 through the adhesive layer.

The cover plate 80 can be a glass cover plate, the adhesive layer can be an optically clear adhesive, an over coat, or other transparent adhesive, and the over coat can be epoxy resins.

When forming the color filter layer 50 on the array substrate 10 having the emissive layer 20, the photoresist material of the black matrix 54, the first color resist 51, the second color resist 52, and the third color resist 53 are separately formed on the emissive layer 20 through a low temperature process, the low temperature process includes coating, baking, curing, and ultraviolet irradiation can be used for curing. In embodiments of the present invention, a curing temperature of the photoresist material ranges from 60 degrees Celsius to 90 degrees Celsius. Advantageously, the curing temperature ranges from 80 degrees Celsius to 90 degrees Celsius. More advantageously, the curing temperature ranges from 85 degrees Celsius to 90 degrees Celsius. In comparison with conventional color filter films of a high temperature process, in embodiments of the present invention, the color filter layer 50 can not only be directly manufactured on the array substrate 10 through a low temperature process, but it also has better optical parameters as described above, decreasing reflectivity of the display panel 100.

Furthermore, a refractive index of the first color resist 51, a refractive index of the second color resist 52, a refractive index of the third color resist 53, and a refractive index of the black matrix 54 are less than or equal to 2. Reflection of ambient light on a surface of the color filter layer 50 is mainly from the black matrix 54. On the one hand, it is because an area occupation ratio of the first color resist 51, the second color resist 52, and the third color resist 53 is less than that of the black matrix 54. On the other hand, it is because a difference between a refractive index of color resist and a refractive index of the contacted functional material layer 70 above is set within the above-described range, more light at a color resist interface penetrates to a lower layer, and reflectivity of the light at the color resist interface can be omitted.

In embodiments of the present invention, a difference between a refractive index of the first color resist 51, the second color resist 52, and the third color resist 53 and a refractive index of the black matrix 54 is greater than or equal to 0 and less than or equal to 0.5. It is beneficial for increasing an angle of vision of emergent light. When a refractive index difference between the color resist and the black matrix 54 is too great, display deteriorates within a large angle of vision range.

When light arrive at a surface of the black matrix 54, a part of the light reflexes upward, a part of the light penetrates the black matrix 54 and transmits toward a lower layer, and therefore reflectivity of the display panel is also related to an optical density value of the black matrix 54. The optical density value of the black matrix 54 is greater than or equal to 1.5, and an optical density value of the pixel definition layer 30 is greater than or equal to 0.5. A reflection effect of the pixel definition layer 30 on the light can be omitted, and reflection after the light penetrating the black matrix 54 is mainly from reflection from metal of the array substrate 10.

When light arrives at a surface of the color resist (51, 52, 53), as described above, reflection of the light on the surface of the color resist can be omitted, and most of the light penetrates the color resist and arrives at sub-pixels in a lower layer. In embodiments of the present invention, a transmittance of the first color resist 51, a transmittance of the second color resist 52, and a transmittance of the third color resist 53 are greater than or equal to 50% and less than 80%.

Referring to FIG. 1, in embodiments of the present invention, reflectivity of the display panel 100 is mainly from following four parts: reflectivity $R_1$ of an exterior surface of the cover plate 80, reflectivity $R_2$ of an non-luminous area (i.e. reflectivity of the black matrix 54), reflectivity $R_3$ at a lower layer of the display panel after light penetrating the black matrix 54, and reflectivity $R_4$ of a luminous area (reflectivity of the first color resist 51, the second color resist 52, and the third color resist 53 above sub-pixels).

Specifically, regarding the reflectivity $R_1$ of the exterior surface of the cover plate 80. When incident light has a zero degrees angle (in a direction perpendicular to the display panel 100), according to Fresnel formula, $R_1=(n_1-n_2)^2/(n_1+n_2)^2$, where $n_1$ is a refractive index of the cover plate 80, and $n_2$ is a refractive index of air, when the cover plate 80 is a glass cover plate and has a refractive index of 1.52, and the refractive index of air is 1, the reflectivity $R_1$ of the exterior surface of the cover plate 80 is 4.2%.

Regarding to the reflectivity of the non-luminous area, that is, the reflectivity $R_2$ of the black matrix 54, it depends on a refractive index difference between the black matrix 54 and the functional material layer 70 and a surface roughness of the black matrix 54, and the surface roughness of the black matrix 54 can be referred to conventional manufacturing processes. Through experiments, the inventor discovered that when the refractive index difference between the black matrix 54 and the functional material layer 70 is greater than or equal to −1 and less than or equal to 0.5, the reflectivity $R_2$ of the black matrix 54 is lower, and an experiment result of R2 is 0.6%. In embodiments of the present invention, the refractive index difference between the black matrix 54 and the functional material layer 70 is greater than 0 and less than or equal to 0.5.

Reflection of light at a lower layer of the display panel 100 after penetrating the black matrix 54 is mainly from reflection of the light from a metal layer on the array substrate 10. Because a distance between metal wiring of the touch control layer 60 and the black matrix 54 is very close (about 2-3 micrometers), or the black matrix 54 directly clads the metal wiring, reflectivity of a contact interface of the black matrix 54 and the metal wiring is very low, and an area occupation ratio of the interface is very small. Therefore, reflectivity of the touch control layer 60 can be omitted and does not have to be considered as a source of reflectivity.

The reflectivity $R_3$ at the lower layer of the display panel 100 after light penetrating the black matrix 54 is $10^{-2OD}\times R_5$, where OD is an optical density of the black matrix 54, and $R_5$ is reflectivity of a metal layer of the array substrate 10. The metal layer of the array substrate 10 can be a three-layered metal composite film layer of titanium/aluminum/titanium, the reflectivity $R_5$ of the metal layer is 50%, the optical density of the black matrix 54 is greater than or equal to 2, and therefore $R_3$ is less than or equal to 0.005%.

The reflectivity $R_4$ of the luminous area includes reflectivity of sub-luminous areas of red, green, and blue luminous areas. The reflectivity $R_4$ depends on transmittance of the first color resist 51, the second color resist 52, and the third color resist 53, and reflectivity of each sub-luminous area $R_{CF}=(T_{CF})^2\times R_P$, where $T_{CF}$ is transmittance of color resist corresponding to each sub-luminous area, and $R_P$ is reflectivity of a pixel corresponding to each sub-luminous area.

In embodiments of the present invention, reflectivity of the entire display panel 100 $R_{Total}=R_1+(R_2+R_3)\times\eta_{BM}+(R_4, R\times\eta_R+R_4, G\times\eta_G+R_4, B\times\eta_B)$, where $\eta_{BM}$ is an area occupation ratio between an area of the black matrix 54 and an area of the entire display area of the display panel 100, $\eta_R$ is an area occupation ratio between an area of the first color resist 51 and the area of the entire display area of the display panel 100, $\eta_G$ is an area occupation ratio between an area of the second color resist 52 and the area of the entire display area of the display panel 100, $\eta_B$ is an area occupation ratio between an area of the third color resist 53 and the area of the entire display area of the display panel 100, and $R_{4, R}$, $R_{4, G}$, and $R_{4, B}$ are reflectivity of sub-luminous areas corresponding to the first color resist 51, the second color resist 52, and the third color resist 53, respectively.

It can be understood from the above, when a material of the metal layer on the array substrate 10 of the display panel and the sub-pixels is decided, main factors affecting reflectivity of the display panel are mainly from the color filter layer 50 on the emissive layer 20. The color filter layer 50 according to embodiments of the present invention not only can be directly formed on the emissive layer 20 through a low temperature manufacturing process to decrease a thickness of films, but it also has optical parameters similar to conventional color filters, thereby decreasing reflectivity of the display panel.

Figure 3:
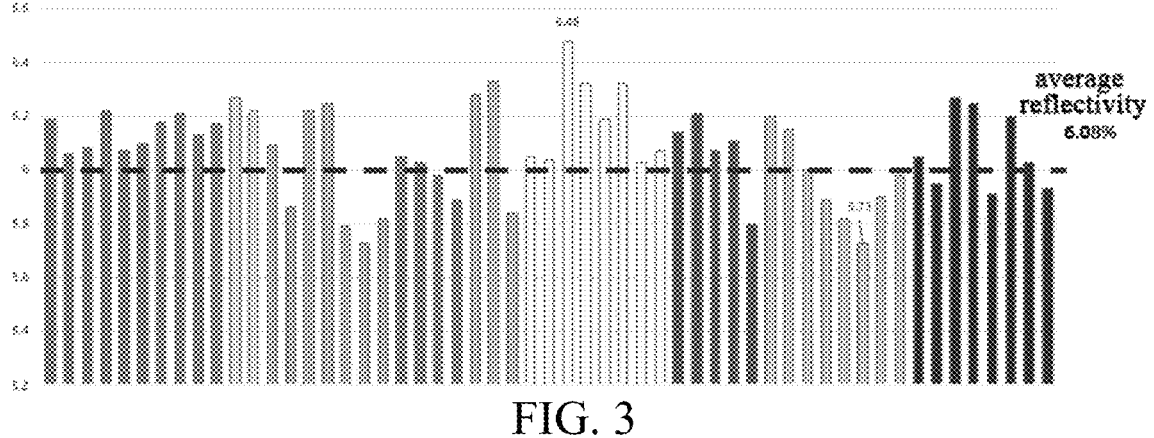
FIG. 3 is a bar graph of reflectivity test of the display panel according to embodiments of the present invention.

Referring to FIG. 3, FIG. 3 is a bar graph of reflectivity of repeated tests of the display panel 100 according to embodiments of the present invention. Abscissa shows test samples, and ordinate shows reflectivity values (%) of each test. It can be seen that in embodiments of the present invention, the largest reflectivity of the display panel 100 is 6.48%, the smallest reflectivity is 5.73%, and the average reflectivity is 6.08%. Wherein, a sample display panel 100 of each test is same, an optical density value of the black matrix 54 is 2.6, a refractive index of the black matrix 54 is 1.5, a refractive index of the first color resist 51, the second color resist 52, and the third color resist 53 is 1.7, transmittance of the first color resist 51, the second color resist 52, and the third color resist 53 is 63%, and a refractive index of the functional material layer 70 is 1.42.

Figure 4:
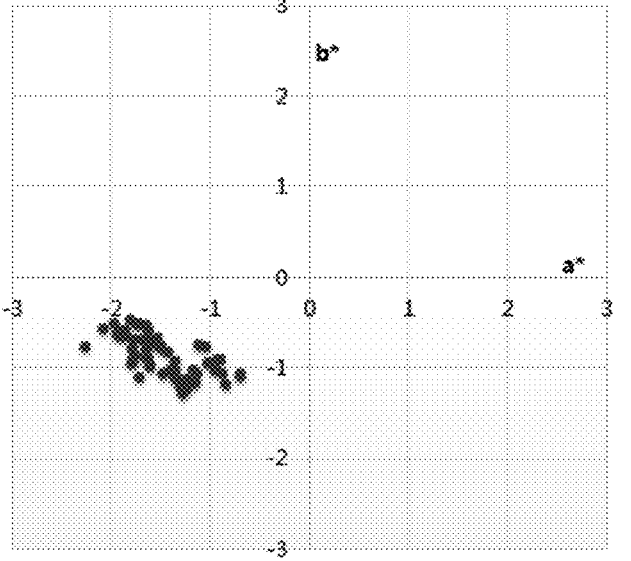
FIG. 4 is a hue diagram of the display panel according to embodiments of the present invention.

Referring FIG. 4 and following table 1, FIG. 4 is hue data of the display panel 100 according embodiments of the present invention, and table 1 is JNCD data table under various angles of vision of the display panel according embodiments of the present invention. Generally speaking, under an angel of vision of 30 degrees, a better JNCD value is greater than or equal to 3. Under an angel of vision of 45 degrees, a better JNCD value is greater than or equal to 4.5. Under an angel of vision of 60 degrees, a better JNCD value is greater than or equal to 5.5. Therefore, the display panel according embodiments of the present invention has a better angel of vision of chromaticity.

TABLE 1

| Display panel | JNCD | | |
|---|---|---|---|
| number | 30° | 45° | 60° |
| 1 | 3.00 | 5.39 | 5.84 |
| 2 | 3.53 | 7.42 | 6.85 |
| 3 | 3.92 | 7.74 | 7.55 |

In the above-described embodiments, description for each embodiment has its emphasis. When there is insufficient description in one embodiment, one can refer to other embodiments for relative description.

Although the present invention has been explained in relation to its preferred embodiment, it does not intend to limit the present invention. It will be apparent to those skilled in the art having regard to this present invention that other modifications of the exemplary embodiments beyond these embodiments specifically described here may be made without departing from the spirit of the invention. Accordingly, such modifications are considered within the scope of the application as limited solely by the appended claims.

What is claimed is:

1. A display panel, comprising:

an array substrate;

an emissive layer disposed on the array substrate and comprising a first sub-pixel, a second sub-pixel, and a third sub-pixel having different colors;

a color filter layer disposed on the emissive layer and comprising a first color resist corresponding to the first sub-pixel, a second color resist corresponding to the second sub-pixel, a third color resist corresponding to the third sub-pixel, and a black matrix separating the first color resist, the second color resist, and the third color resist, wherein a material of the first color resist, a material of the second color resist, a material of the third color resist, and a material of the black matrix all comprise a photoresist material; and a functional material layer disposed on one side face of the color filter layer away from the emissive layer, wherein a difference between a refractive index of the first color resist, the second color resist, the third color resist, and the black matrix and a refractive index of the functional material layer is greater than or equal to −1 and less than or equal to 0.5, and wherein a pixel definition layer is disposed between the array substrate and the color filter layer and comprises a plurality of openings, and the first sub-pixel, the second sub-pixel, and the third sub-pixel are separately located in a corresponding opening;

wherein an optical density value of the black matrix is greater than or equal to 1.5, an optical density value of the pixel definition layer is greater than or equal to 0.5, and a transmittance of the first color resist, a transmittance of the second color resist, and a transmittance of the third color resist are all greater than or equal to 50% and less than 80%.

2. The display panel as claimed in claim 1, wherein a refractive index of the first color resist, a refractive index of the second color resist, a refractive index of the third color resist, and a refractive index of the black matrix are all less than or equal to 2, and a difference between a refractive index of the first color resist, the second color resist, and the third color resist and a refractive index of the black matrix is greater than or equal to 0 and less than or equal to 0.5.

3. The display panel as claimed in claim 1, wherein a material of the pixel definition layer is a black organic material, and an orthographic projection of the black matrix on the array substrate is located in an orthographic projection of the pixel definition layer on the array substrate.

4. The display panel as claimed in claim 3, wherein a touch control layer is disposed between the color filter layer and the emissive layer, the touch control layer comprises a plurality of touch control electrodes, and an orthographic projection of the touch control electrodes on the array substrate is located in the orthographic projection of the black matrix on the array substrate.

5. The display panel as claimed in claim 3, wherein the black matrix and at least one adjacent color resist have a gap therebetween to define a blank area, and an orthographic projection of the blank area on the array substrate is located in the orthographic projection of the pixel definition layer on the array substrate.

6. The display panel as claimed in claim 3, wherein the orthographic projection of the black matrix on the array substrate partially overlaps an orthographic projection of any one adjacent color resist on the array substrate.

7. The display panel as claimed in claim 1, wherein a curing temperature of the photoresist material ranges from 60 degrees Celsius to 90 degrees Celsius.

8. The display panel as claimed in claim 7, wherein in mass percentage, the material of the black matrix comprises 40%-50% of propylene glycol monomethyl ether acetate, 30%-40% of cyclohexanone, 1%-10% of carbon black, 5%-15% of acrylic resin, and 1%-5% of dimethyl succinate;

wherein in the mass percentage, the material of the first color resist, the material of the second color resist, and the material of the third color resist comprise 70%-80% of 2-acetoxy-1-methoxypropane, 5%-15% of 3-methoxy-3-methyl-1-butyl acetate, 1%-10% of a mixture of pentaerythritol triacrylate and pentaerythritol tetraacrylate, 1%-10% of light-sensitive resin, and 1%-10% of pigment or dye.

9. A display panel, comprising:

an array substrate;

an emissive layer disposed on the array substrate and comprising a first sub-pixel, a second sub-pixel, and a third sub-pixel having different colors;

a color filter layer disposed on the emissive layer and comprising a first color resist corresponding to the first sub-pixel, a second color resist corresponding to the second sub-pixel, a third color resist corresponding to the third sub-pixel, and a black matrix separating the first color resist, the second color resist, and the third color resist; and a functional material layer disposed on one side of the color filter layer away from the emissive layer, wherein a difference between a refractive index of the color filter layer and a refractive index of the functional material layer is greater than or equal to −1 and less than or equal to 0.5, and wherein a pixel definition layer is disposed between the array substrate and the color filter layer and comprises a plurality of openings, and the first sub-pixel, the second sub-pixel, and the third sub-pixel are separately located in a corresponding opening;

wherein an optical density value of the black matrix is greater than or equal to 1.5, an optical density value of the pixel definition layer is greater than or equal to 0.5, and a transmittance of the first color resist, a transmittance of the second color resist, and a transmittance of the third color resist are all greater than or equal to 50% and less than 80%.

10. The display panel as claimed in claim 9, wherein the functional material layer directly contacts one side face of the color filter layer away from the array substrate, and a difference between a refractive index of the first color resist, the second color resist, the third color resist, and the black matrix and the refractive index of the functional material layer is greater than or equal to −1 and less than or equal to 0.5.

11. The display panel as claimed in claim 10, wherein a refractive index of the first color resist, a refractive index of the second color resist, a refractive index of the third color resist, and a refractive index of the black matrix are all less than or equal to 2, and a difference between a refractive index of the first color resist, the second color resist, and the third color resist and a refractive index of the black matrix is greater than or equal to 0 and less than or equal to 0.5.

12. The display panel as claimed in claim 9, wherein a material of the pixel definition layer is a black organic material, and an orthographic projection of the black matrix on the array substrate is located in an orthographic projection of the pixel definition layer on the array substrate.

13. The display panel as claimed in claim 12, wherein a touch control layer is disposed between the color filter layer and the emissive layer, the touch control layer comprises a plurality of touch control electrodes, and an orthographic projection of the touch control electrodes on the array substrate is located in the orthographic projection of the black matrix on the array substrate.

14. The display panel as claimed in claim 12, wherein the black matrix and at least one adjacent color resist have a gap therebetween to define a blank area, and an orthographic projection of the blank area on the array substrate is located in the orthographic projection of the pixel definition layer on the array substrate.

15. The display panel as claimed in claim 12, wherein the orthographic projection of the black matrix on the array substrate partially overlaps an orthographic projection of any one adjacent color resist on the array substrate.

16. The display panel as claimed in claim 9, wherein a material of the first color resist, a material of the second color resist, a material of the third color resist, and a material of the black matrix all comprise a photoresist material, and a curing temperature of the photoresist material ranges from 60 degrees Celsius to 90 degrees Celsius.

17. The display panel as claimed in claim 16, wherein the photoresist material comprises acrylic doped with pigment, dye, or carbon black.

18. The display panel as claimed in claim 17, wherein in mass percentage, the material of the black matrix comprises 40%-50% of propylene glycol monomethyl ether acetate, 30%-40% of cyclohexanone, 1%-10% of the carbon black, 5%-15% of acrylic resin, and 1%-5% of dimethyl succinate;

wherein in the mass percentage, the material of the first color resist, the material of the second color resist, and the material of the third color resist comprise 70%-80% of 2-acetoxy-1-methoxypropane, 5%-15% of 3-methoxy-3-methyl-1-butyl acetate, 1%-10% of a mixture of pentaerythritol triacrylate and pentaerythritol tetraacrylate, 1%-10% of light-sensitive resin, and 1%-10% of the pigment or the dye.

19. A display panel, comprising:

an array substrate;

an emissive layer disposed on the array substrate and comprising a first sub-pixel, a second sub-pixel, and a third sub-pixel having different colors;

a color filter layer disposed on the emissive layer and comprising a first color resist corresponding to the first sub-pixel, a second color resist corresponding to the second sub-pixel, a third color resist corresponding to the third sub-pixel, and a black matrix separating the first color resist, the second color resist, and the third color resist, wherein a material of the first color resist, a material of the second color resist, a material of the third color resist, and a material of the black matrix all comprise a photoresist material; and a functional material layer disposed on one side face of the color filter layer away from the emissive layer, wherein a difference between a refractive index of the first color resist, the second color resist, the third color resist, and the black matrix and a refractive index of the functional material layer is greater than or equal to −1 and less than or equal to 0.5, wherein a curing temperature of the photoresist material ranges from 60 degrees Celsius to 90 degrees Celsius, wherein in mass percentage, the material of the black matrix comprises 40%-50% of propylene glycol monomethyl ether acetate, 30%-40% of cyclohexanone, 1%-10% of carbon black, 5%-15% of acrylic resin, and 1%-5% of dimethyl succinate; and wherein in the mass percentage, the material of the first color resist, the material of the second color resist, and the material of the third color resist comprise 70%-80% of 2-acetoxy-1-methoxypropane, 5%-15% of 3-methoxy-3-methyl-1-butyl acetate, 1%-10% of a mixture of pentaerythritol triacrylate and pentaerythritol tetraacrylate, 1%-10% of light-sensitive resin, and 1%-10% of pigment or dye.

* * * * *